United States Patent
Chen et al.

(10) Patent No.: US 8,967,565 B2
(45) Date of Patent: Mar. 3, 2015

(54) MOUNT BRACKET FOR SLIDE ASSEMBLY

(75) Inventors: Ken-Ching Chen, Kaohsiung (TW);
Shun-Ho Yang, Kaohsiung (TW);
Chien-Li Huang, Kaohsiung (TW);
Yao-Tsung Chen, Kaohsiung (TW);
Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 131 days.

(21) Appl. No.: 13/607,988

(22) Filed: Sep. 10, 2012

(65) Prior Publication Data
US 2014/0070064 A1 Mar. 13, 2014

(51) Int. Cl.
*A47B 96/07* (2006.01)
*A47B 88/04* (2006.01)

(52) U.S. Cl.
CPC .................................. *A47B 88/044* (2013.01)
USPC .............. 248/221.11; 248/298.1; 248/222.11; 211/192

(58) Field of Classification Search
CPC . A47B 88/044; A47B 96/1441; H05K 7/1489
USPC ......... 248/221.11, 222.11, 218.4, 298.1, 244, 248/224.8, 235, 239; 211/192, 26; 312/334.4, 333, 334.1; 403/325, 326, 403/329, 322.1, 109.3; 292/83, 303, 80, 81, 292/86, 87, 300, 1, 137, 170, DIG. 37, 292/DIG. 11, DIG. 16, DIG. 63
See application file for complete search history.

(56) References Cited

U.S. PATENT DOCUMENTS

| | | | |
|---|---|---|---|
| 4,784,361 A * | 11/1988 | Kobayashi et al. | 248/551 |
| 7,703,734 B2 * | 4/2010 | Chen et al. | 248/298.1 |
| 7,857,145 B2 | 12/2010 | Mushan et al. | |
| 8,104,626 B2 | 1/2012 | Huang et al. | |
| 8,146,756 B2 * | 4/2012 | Brock et al. | 211/192 |
| 8,550,416 B2 * | 10/2013 | Yu et al. | 248/298.1 |
| 2008/0296455 A1 * | 12/2008 | Brock et al. | 248/298.1 |
| 2009/0166485 A1 * | 7/2009 | Chen et al. | 248/200 |
| 2009/0261699 A1 * | 10/2009 | Yu et al. | 312/334.46 |
| 2009/0309471 A1 * | 12/2009 | Yu et al. | 312/334.44 |
| 2010/0194252 A1 * | 8/2010 | Liang | 312/223.2 |
| 2011/0192946 A1 * | 8/2011 | Yu et al. | 248/222.11 |

* cited by examiner

*Primary Examiner* — Terrell McKinnon
*Assistant Examiner* — Ingrid M Weinhold
(74) *Attorney, Agent, or Firm* — Rosenberg, Klein & Lee (57) ABSTRACT

A mount bracket includes a fixing frame, an installation unit, a movable member, a positioning member and a release member. The fixing frame includes a side wall and an end wall. The movable member has a first board movably connected to the side wall and a second board. The first board includes an engaging hole and a contact portion. The positioning member is fixed to the side wall and has an engaging portion. The movable member is movably connected to the first board. When in assembling, the contact portion and the second board contact the inside and outside of a post of a rack. The fixing frame is pushed toward the post to insert the installation unit into the holes of the post. The engaging portion of the positioning member is engaged with the engaging hole of the movable member to connect the movable member to the fixing frame.

10 Claims, 7 Drawing Sheets

MOUNT BRACKET FOR SLIDE ASSEMBLY

Conventional mount brackets for a slide assembly are disclosed in U.S. Pat. No. 7,857,145 to Mushan, U.S. Pat. No. 8,104,626 to Huang, and U.S. Pat. No. 8,146,756 to Brock.

FIELD OF THE INVENTION

The present invention relates to a mount bracket, and more particularly, to a toolless mount bracket for a slide assembly by one assembler.

BACKGROUND OF THE INVENTION

The conventional mount brackets are complicated in shape and structure, and require two assemblers to install the mount brackets at the front and rear sides of the rack. If only one assembler is available, the assembler has to install the locking mechanism respectively at the front and rear side of the rack. It requires too much time and labor to install the mount bracket.

The present invention intends to provide a toolless mount bracket for a slide assembly, and requires only one assembler at one position to complete the installation.

SUMMARY OF THE INVENTION

According to one aspect of the present invention, the mount bracket is connected to a slide assembly and installed to a post of a rack. The post has a plurality of holes. The mount bracket comprises a fixing frame having a side wall, an end wall, and two protrusions respectively extending from a top side and a bottom side of the sidewall. The two protrusions and the side wall define a first path. The side wall has a recess and defines a second path. An installation unit is fixed to the end wall of the fixing frame. A movable member has a first board and a second board, wherein the first board is inserted into the first path of the fixing frame. The first board has a contact portion and a support frame. The support frame is inserted into the second path of the fixing frame and the contact portion is located adjacent to the second board. The support frame has an engaging hole. The second board has a plurality of holes which are located corresponding to the installation unit. A positioning member has a fixing portion, a resilient arm, an activation portion and an engaging portion. The fixing portion is fixed to the side wall of the fixing frame. The resilient arm is connected between the fixing portion and the activation portion. The activation portion extends an angle from one end of the resilient arm. The activation portion is located on the resilient arm and located corresponding to the engaging hole of the movable member. A release member is movably connected to the first board of the movable ember and has a push block which is located corresponding to the activation portion of the positioning member. When in assembling, the contact portion of the movable member and the second board contact the inside and outside of the post of the rack. The installation unit is located corresponding to the holes of the post. The fixing frame is pushed toward the post to insert the installation unit into the holes of the post. The engaging portion of the positioning member is engaged with the engaging hole of the movable member to connect the movable member to the fixing frame. When pushing the release member, the push block of the release member contacts the activation portion of the positioning member. The resilient arm of the positioning member is lifted relative to the movable member. The engaging portion of the positioning member is disengaged from the engaging hole of the movable member. The movable member is movable relative to the fixing frame. The installation unit of the mount bracket is removed from the post.

Preferably, the side wall of the fixing frame has two connection holes. The first board of the movable member has two through holes located corresponding to the connection holes of the side wall. The through holes are respectively cooperated with the connection holes. The through holes or the connection holes are in the form of elongated hole. Two connection members extend through the through holes and the connection holes to movably connect the movable member to the fixing frame.

Preferably, the side wall of the fixing frame has a stop which extends to a window of the side wall. The stop is located corresponding to the release member.

Preferably, the installation unit has two installation members and a positioning block is located between the two installation members. The positioning block has a threaded hole defined therethrough and the threaded hole is located corresponding to the end wall of the fixing frame.

Preferably, the release member has an operation portion and a connection portion extending between the push block and the operation portion. The push block has an inclined face located corresponding to the activation portion of the positioning member.

Preferably, the push block of the release member has a neck connected to the connection portion and the first board has a slot through which the neck extends so that the release member is movably connected to the support frame of the movable member.

Preferably, the side wall of the fixing frame has a stop which is located corresponding to the push block or the neck such that the release member does not be separated from the movable member.

According to another aspect of the present invention, the mount bracket comprises a fixing frame having a side wall, an end wall extending perpendicularly from an end of the side wall, and two protrusions respectively extending from a top side and a bottom side of the side wall. The two protrusions and the side wall define a first path. The side wall has two connection holes, a recess located between the connection holes, and a stop. The recess extends to the end wall and defines a second path. A window is defined through the side wall and communicates with the recess. An installation unit is fixed to the end wall of the fixing frame and comprises two installation members. A movable member has a first board and a second board which extends an angle from the first board. The first board is inserted into the first path of the fixing frame. The first board has a through hole, a contact portion and a slot. The through hole is located corresponding to the connection hole. A connection member extends through the through hole and the connection hole to movably connect the movable member to the fixing frame. The contact portion is located adjacent to the second board. The support frame is inserted into the second path of the fixing frame and the support frame has an engaging hole. The second board has a plurality of holes which are located corresponding to the installation members of the installation unit. A positioning member has a fixing portion, a resilient arm, an activation portion and an engaging portion. The fixing portion is fixed to the side wall of the fixing frame. The resilient arm is connected between the fixing portion and the activation portion. The activation portion extends an angle from one end of the resilient arm. The activation portion is located on the resilient arm and located corresponding to the engaging hole of the movable member. The activation portion and the engaging portion extend through the window of the fixing frame. A release member has a push block, an operation portion and a connection portion which is connected between the push block and the operation portion. The push block has an inclined face which is located corresponding to the activation portion of the positioning member. The release member is movably connected to the support frame of the movable member.

The primary object of the present invention is to provide a mount bracket for a slide assembly and the installation requires only one assembler who does not need to move to complete the assembling process.

When assembling the mount bracket to the post of the rack, no tool needed, the assembler simply connects the mount bracket to the post of the rack and pushes the mount bracket. The mount bracket is connected to the post of the rack.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
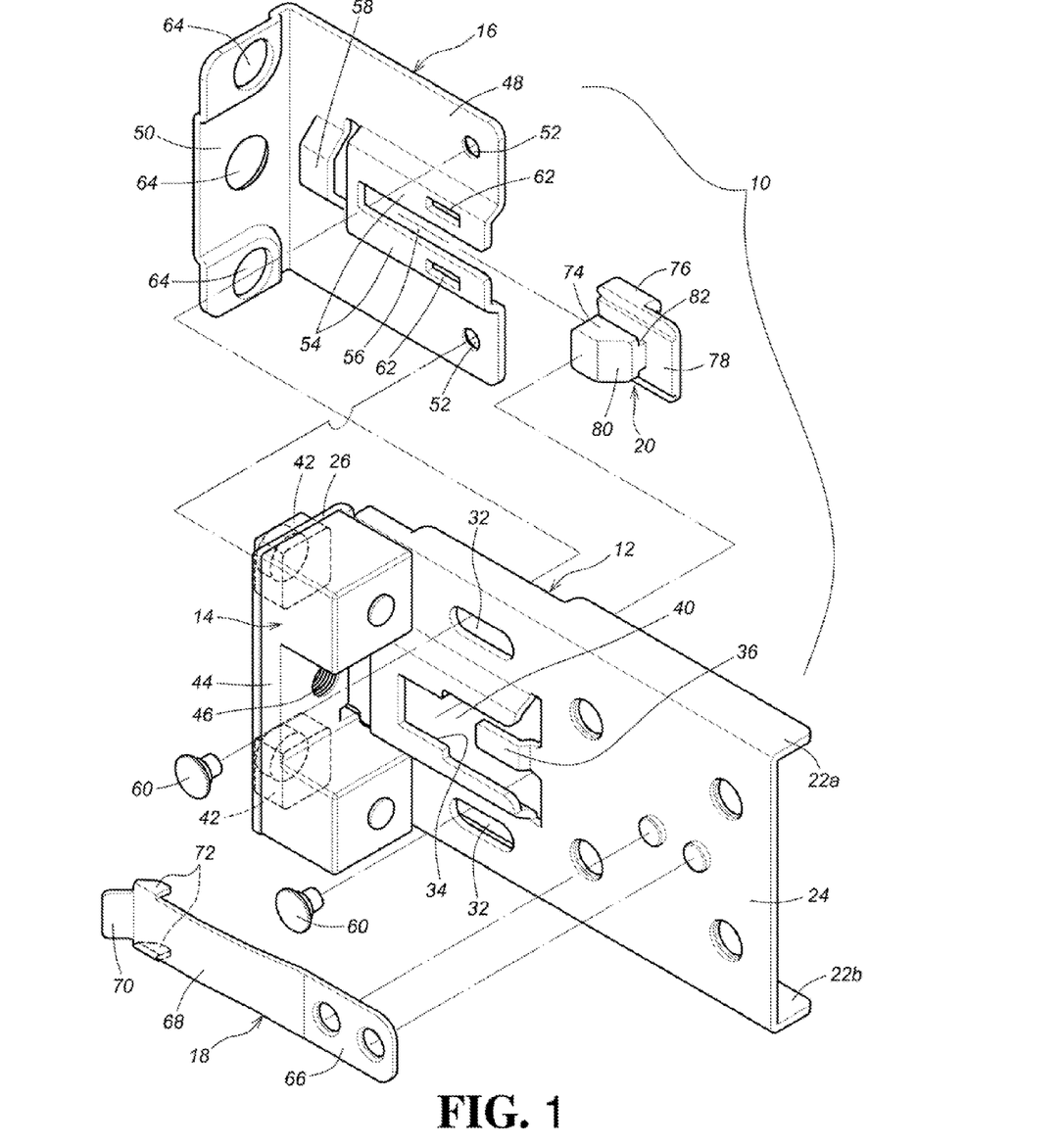
FIG. 1 is an exploded view to show the mount bracket of the present invention.
Figure 2:
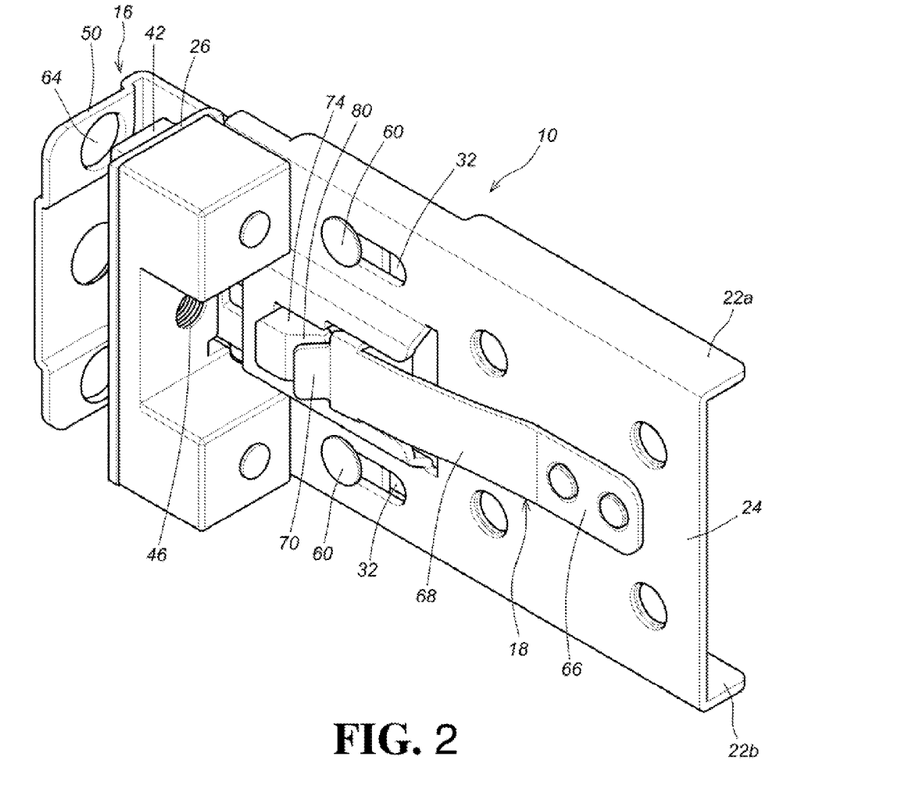
FIG. 2 is a perspective view to show the mount bracket of the present invention.

Referring to FIG. 1, the mount bracket 10 of the present invention comprises a fixing frame 12, an installation unit 14, a movable member 16, a positioning member 18 and a release member 20.

Figure 3:
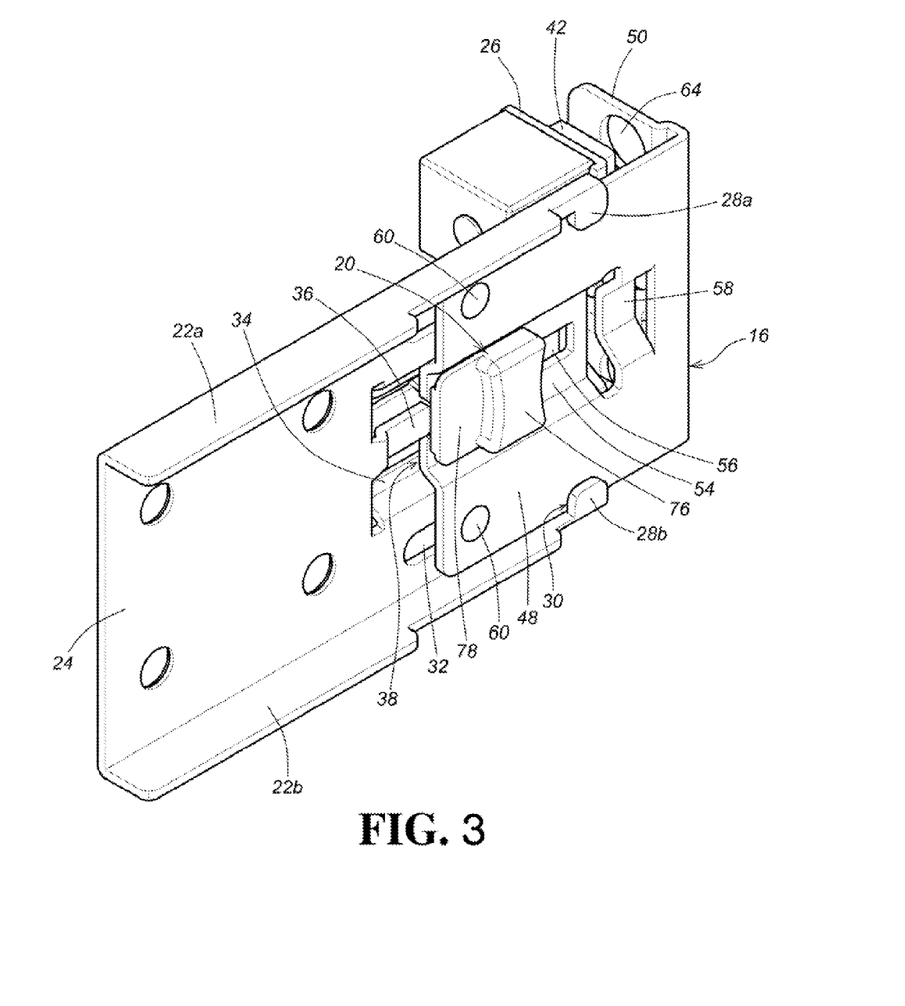
FIG. 3 is another perspective view viewed from rear side of the mount bracket in FIG. 1.

The fixing frame 12 has a top flange 22a, a bottom flange 22b, a side wall 24 connected between the top and bottom flanges 22a, 22b, and an end wall 26 substantially and perpendicularly extending from one end of the side wall 24. The top flange 22a has a downward protrusion 28a and the bottom flange 22b has an upward protrusion 28b which is located corresponding to the protrusion 28a. The two protrusions 28a, 28b and the side wall 24 define a first path 30 as shown in FIG. 3. The side wall 24 has two connection holes 32, a recess 34 located between the connection holes 32, and a stop 36. The recess 34 extends to the adjacent end wall 26 and defines a second path 38 as shown FIG. 3. A window 40 is defined through the side wall 24 and communicating with the recess 34. The stop 36 extends to the window 40.

The installation unit 14 is fixed to the end wall 26 of the fixing frame and comprises two installation members 42 and a positioning block 44 connected between the two installation members 42. The positioning block 44 has a threaded hole 46 defined therethrough and located corresponding to the end wall 26 so that a bolt (not shown) is threadedly connected to the threaded hole 46.

The movable member 16 has a first board 48 and a second board 50 extending an angle from the first board 48. The first board 48 is inserted into the first path 30 of the fixing frame 12 and comprises two through holes 54, two support frames 54, a slot 56 located between the support frames 54, and a contact portion 58 located adjacent to the second board 50. The through holes 52 are located corresponding to the connection holes 32. The through holes 52 or the connection holes (32) are in the form of elongated slots. Two connection members 60 extend through the through holes 52 and the connection holes 32 to movably connect the movable member 16 to the fixing frame 12. Each of the support frames 54 has an engaging hole 62. The second board 50 has a plurality of holes 64 which are located corresponding to the installation members 42 and the threaded hole 46.

The positioning member 18 has a fixing portion 66, a resilient arm 68, an activation portion 70 and an engaging portion 72, wherein the fixing portion 66 is fixed to the side wall 24 of the fixing frame 12, and the resilient arm 68 is connected between the fixing portion 66 and the activation portion 70. The activation portion 70 extends an angle from one end of the resilient arm 68. The engaging portions 72 extend from two sides of the resilient arm 68. The activation portion 70 and the engaging portions 72 extend through the window 40 of the fixing frame 12.

The release member 20 has a push block 74, an operation portion 76 and a connection portion 78 connected between the push block 74 and the operation portion 76. The push block 74 has an inclined face 80 which is located corresponding to the activation portion 70 of the positioning member 18. The push block 74 is connected to the connection portion 78 by a neck 82.

The movable member 16 is inserted into the first path 30 of the fixing frame 12 by inserting the first board 48 inserted into the first path 30 of the fixing frame 12. The support frames 54 are inserted into the second path 38 of the side wall 24. The neck 82 of the release member 20 is inserted into the slot 56 of the movable member 16 so that the release member 20 is movably connected to the support frames 54. The neck 82 or the push block 74 is located corresponding to the stop 36 of the fixing frame 12 to restrict the release member 20 and avoid the release member 20 from being separated from the movable member 16. The inclined face 80 of the push block 74 is located corresponding to the activation portion 70 of the positioning member 18.

Figure 4:
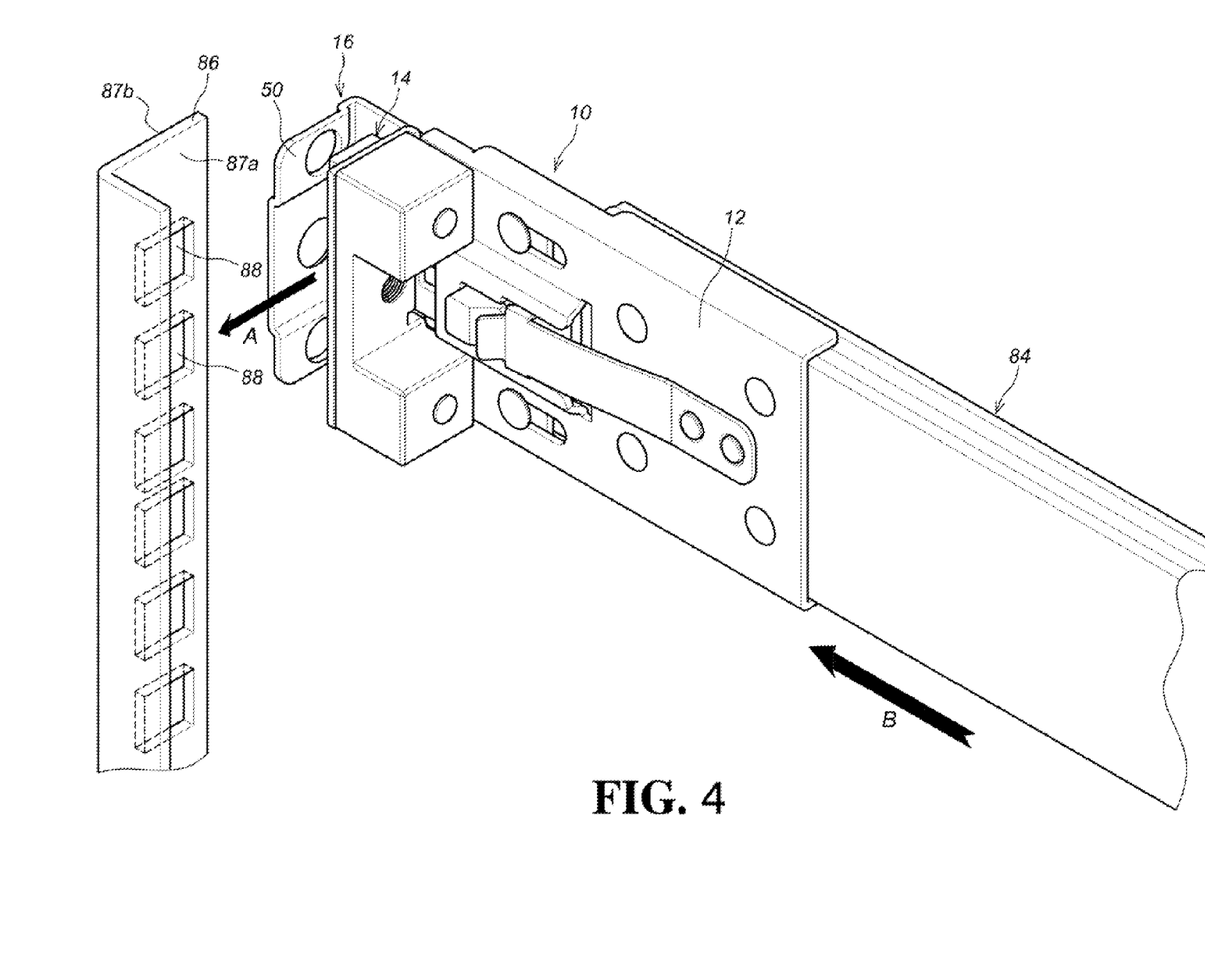
FIG. 4 shows the installation direction of the mount bracket of the present invention.

As shown in FIG. 4, when in use, the fixing frame 12 is connected to the slide assembly 84 whose two ends each have one mount bracket 10 connected thereto, while only one is disclosed in the drawings. The four posts 86 of the rack form an upright support structure and each post 86 has a plurality of holes 88 (only one post is disclosed). When the mount bracket 10 is installed to the post 86, the user holds the slide assembly 84 and the mount bracket 10 faces the post 86 at the remote end. The mount bracket 10 is installed along the direction "A" shown in FIG. 4 to contact the post 86 and then moves the slide assembly 84 in the direction "B" to move the fixing frame 12 toward the post 86. The fixing frame 12 is then locked to the movable member 16 to install the mount bracket 10 to the post 86.

Figure 5:
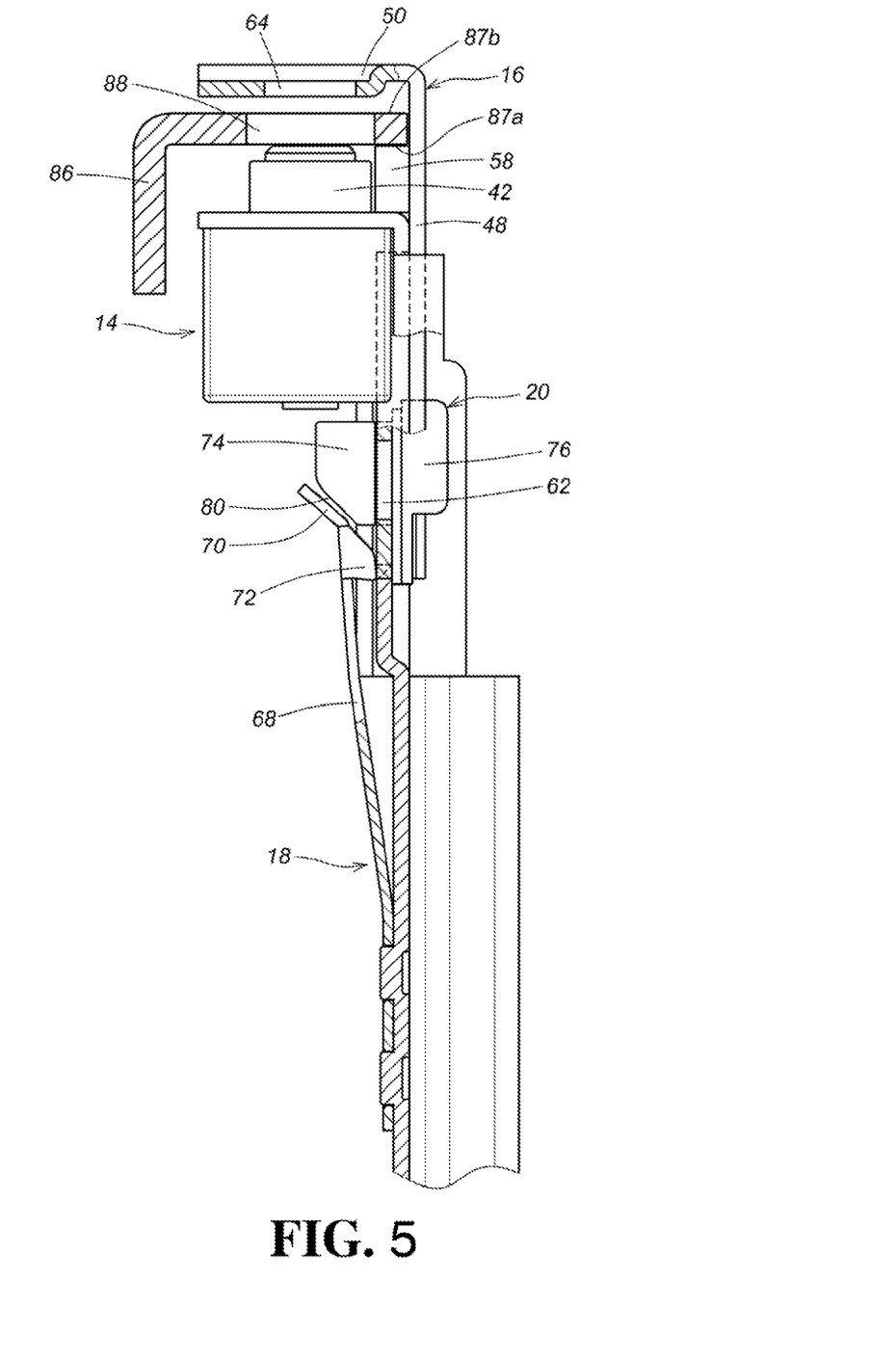
FIG. 5 is an end cross sectional view to show the installation of the mount bracket of the present invention.
Figure 6:
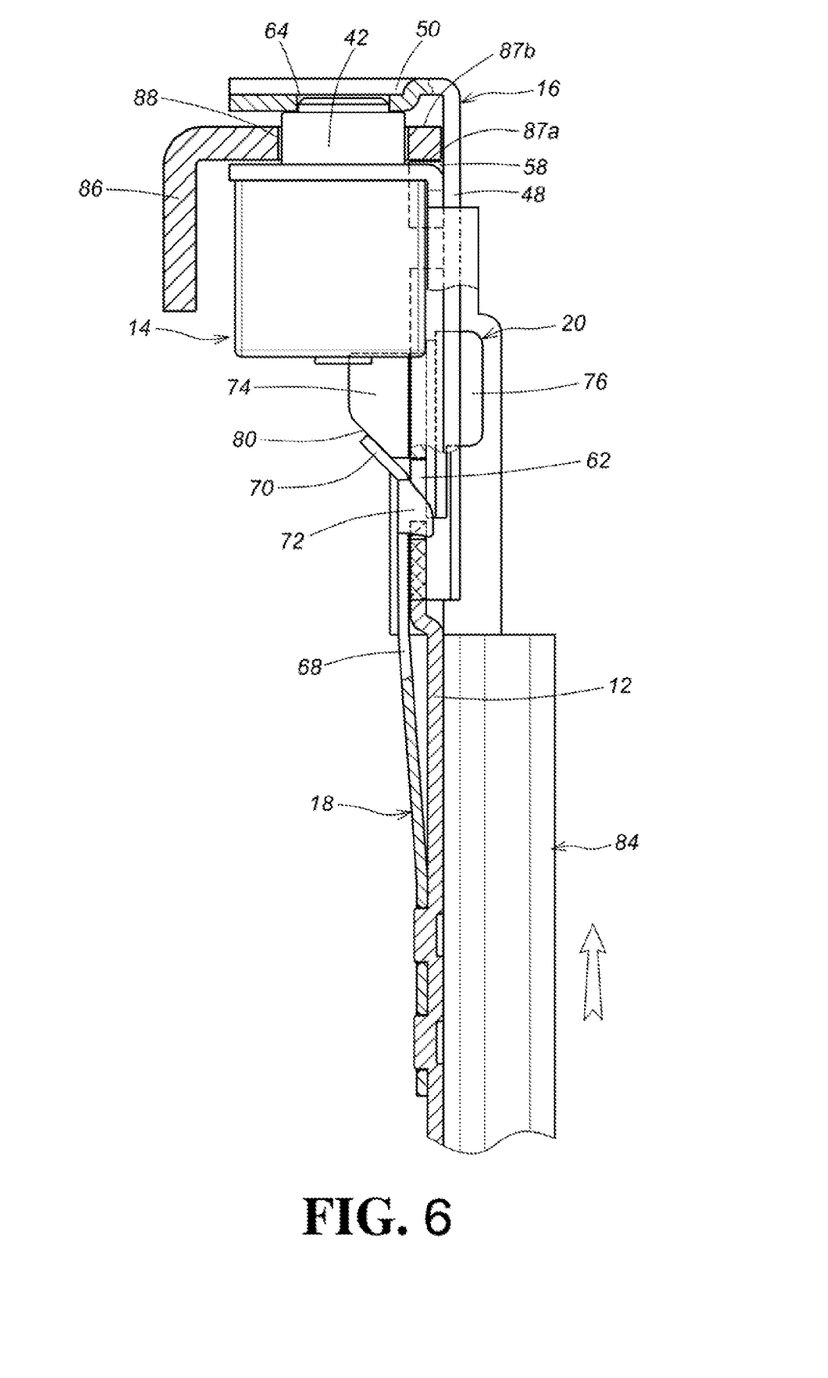
FIG. 6 is an end cross sectional view to show that the mount bracket of the present invention is installed.

During the installation action, when the mount bracket 10 is in contact with the post 86 in the direction "A", as shown in FIG. 5, the contact portion 58 of the movable member 16 and the second board 50 are in contact with the inside 87a and outside 87b of the post 86 of the rack, so that the movable member 16 temporarily contacts the post 86. The installation member 42 of the installation unit 14 is located corresponding to the holes 88 of the post 86. When the slide assembly 84 is moved toward the direction "B", the fixing frame 12 is pushed toward the post 86 to insert the installation member 42 of the installation unit 14 into the holes 88 of the of the post 86. The fixing frame 12 is movable relative to the movable member 16 so that the engaging portion 72 of the positioning member 18 is engaged with the engaging hole 62 of the movable member 16 to connect the movable member 16 to the fixing frame 12. The mount bracket 10 is conveniently installed at the remote end by the extension of the slide assembly 84. Only one assembler is required to quickly install the slide assembly 84 and the mount bracket 10 to the post 86.

Figure 7:
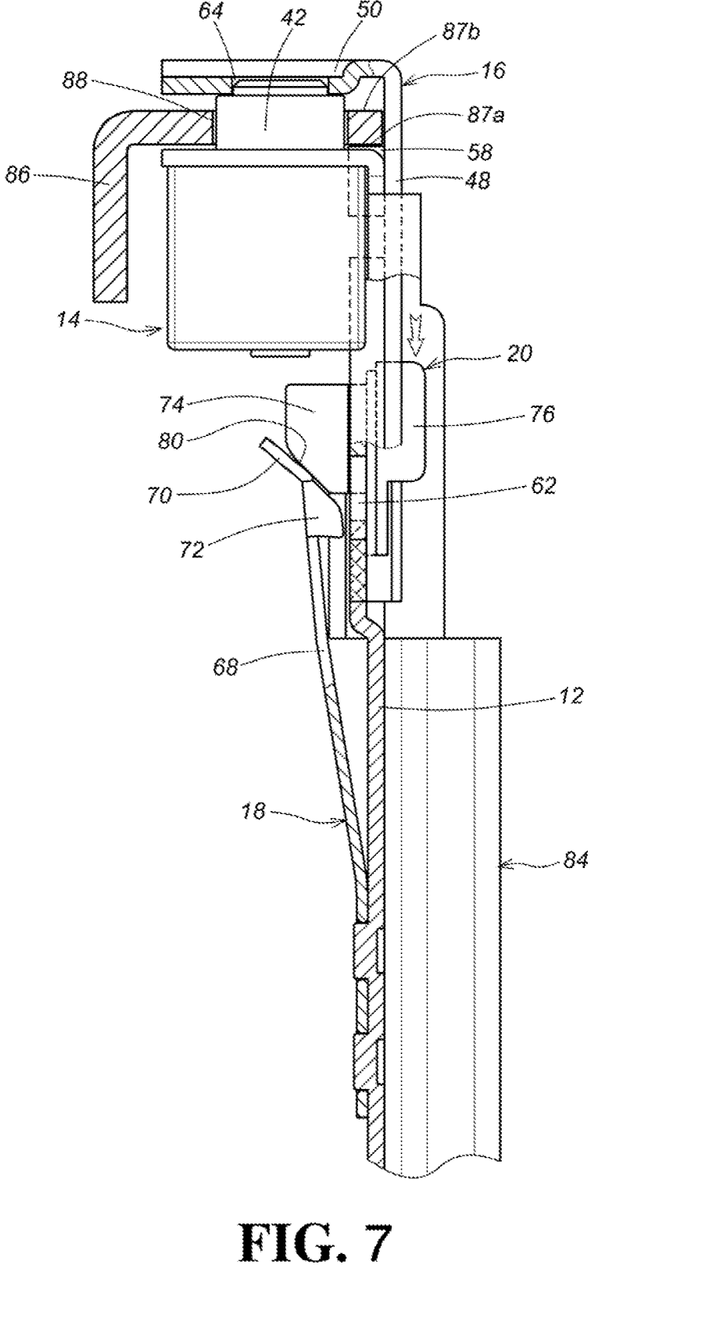
FIG. 7 shows that the mount bracket of the present invention is released.

When releasing the connection between the fixing frame 12 and the movable member 16 so as to remove the mount bracket 10 from the post 86 as shown in FIG. 7, the operation portion 76 of the release member 20 is pushed, the inclined face 80 of the push block 74 of the release member 20 contacts the activation portion 70 of the positioning member 18 so that the resilient, arm 68 of the positioning member 18 is lifted relative to the movable member 16. The engaging portion 72 of the positioning member 18 is disengaged from the engaging hole 62 of the movable member 16. The movable member 16 is movable relative to the fixing frame 12. By pulling the fixing frame 12, the installation member 42 of the mount bracket 10 is removed from the post 86.

While we have shown and described the embodiment in accordance with the present invention, it should be clear to those skilled in the art that further embodiments may be made without departing from the scope of the present invention.

What is claimed is:

1. A mount bracket connected to a slide assembly and installed to a post of a rack, the post having a plurality of holes, the mount bracket comprising:
a fixing frame having a side wall, an end wall, and two protrusions respectively extending from a top side and a bottom side of the side wall, the two protrusions and the side wall defining a first path, the side wall having a recess and defining a second path;
an installation unit fixed to the end wall of the fixing frame;
a movable member having a first board and a second board, the first board inserted into the first path of the fixing frame, the first board having a contact portion and a support frame, the support frame inserted into the second path of the fixing frame and the contact portion located adjacent to the second board, the support frame having an engaging hole, the second board having a plurality of holes located corresponding to the installation unit;
a positioning member having a fixing portion, a resilient arm, an activation portion, and an engaging portion, the fixing portion fixed to the side wall of the fixing frame, the resilient arm connected between the fixing portion and the activation portion, the activation portion extending at an angle to project from an end of the resilient arm away from the side wall, the engaging portion projecting from the resilient arm toward the side wall to selectively engage the engaging hole of the movable member;
a release member movably connected to the first board of the movable member and having a push block located to selectively contact the activation portion of the positioning member;
wherein the contact portion of the movable member and the second board respectively are located on the inside and outside of the post of the rack when assembled thereto, the installation unit being located corresponding to the holes of the post for insert into the holes of the post, the engaging portion of the positioning member being engaged with the engaging hole of the movable member to connect the movable member to the fixing frame, and wherein the push block of the release member contacts the activation portion of the positioning member when the release member is actuated, the resilient arm of the positioning member being thereby lifted relative to the movable member, the engaging portion of the positioning member being responsively disengaged from the engaging hole of the movable member to free the movable member for movement relative to the fixing frame, whereby the installation unit of the mount bracket is able to be removed from the post.

2. The mount bracket as claimed in claim 1, wherein the side wall of the fixing frame has two connection holes, the first board of the movable member has two through holes located corresponding to the connection holes of the side wall, the through holes are respectively cooperated with the connection holes, the through holes or the connection holes are in the form of elongated slots, two connection members extend through the through holes and the connection holes to movably connect the movable member to the fixing frame.

3. The mount bracket as claimed in claim 1, wherein the side wall of the fixing frame has a stop which extends within a window of the side wall, the stop is located corresponding to the release member.

4. The mount bracket as claimed in claim 1, wherein the installation unit has two installation members and a positioning block located between the two installation members, the positioning block has a threaded hole defined therethrough and the threaded hole is located corresponding to the end wall of the fixing frame.

5. The mount bracket as claimed in claim 1, wherein the release member has an operation portion, and a connection portion extending between the push block and the operation portion, the push block has an inclined face located corresponding to the activation portion of the positioning member.

6. The mount bracket as claimed in claim 1, wherein the push block of the release member has a neck connected to a connection portion and the first board has a slot through which the neck extends so that the release member is movably connected to the support frame of the movable member.

7. The mount bracket as claimed in claim 6, wherein the side wall of the fixing frame has a stop which is located corresponding to the push block or the neck such that the release member does not separate from the movable member.

8. A mount bracket, comprising:
a fixing frame having a side wall, an end wall extending perpendicularly from an end of the side wall, and two protrusions respectively extending from a top side and a bottom side of the side wall, the two protrusions and the side wall defining a first path, the side wall having two connection holes, a recess, and a stop, the recess being located between the connection holes, the recess extending to the end wall and defining a second path, a window defined through the side wall and communicating with the recess;
an installation unit fixed to the end wall of the fixing frame and comprising two installation members;
a movable member having a first board, and a second board extending at an angle from the first board, the first board inserted into the first path of the fixing frame, the first board having two through holes, a contact portion, and a slot, each of the through holes located corresponding to each of the connection holes, two connection members respectively extending through the through holes and the connection holes to movably connect the movable member to the fixing frame, the contact portion located adjacent to the second board, a support frame inserted into the second path of the fixing frame and the support frame having an engaging hole, the second board having a plurality of holes located corresponding to the installation members of the installation unit;

a positioning member having a fixing portion, a resilient arm, an activation portion, and an engaging portion, the fixing portion fixed to the side wall of the fixing frame, the resilient arm connected between the fixing portion and the activation portion, the activation portion extending at an angle to project from an end of the resilient arm away from the side wall, the engaging portion projecting from the resilient arm toward the side wall to selectively engage the engaging hole of the movable member, the engaging portion extending through the window of the fixing frame when engaging the engaging hole, and a release member having a push block, an operation portion, and a connection portion between the push block and the operation portion, the push block having an inclined face located to selectively contact the activation portion of the positioning member, the release member being movably connected to the support frame of the movable member.

9. The mount bracket as claimed in claim 8, wherein the push block of the release member has a neck connected to the connection portion and the neck extends through the slot of the movable member so that the release member is movably connected to the support frame of the movable member.

10. The mount bracket as claimed in claim 9, wherein the stop of the side wall of the fixing frame is located corresponding to the push block or the neck such that the release member does not separate from the movable member.

* * * * *